(12) United States Patent
Gleason et al.

(10) Patent No.: US 10,562,809 B2
(45) Date of Patent: Feb. 18, 2020

(54) LOW K DIELECTRIC COMPOSITIONS FOR HIGH FREQUENCY APPLICATIONS

(71) Applicant: Ferro Corporation, Mayfield Heights, OH (US)

(72) Inventors: Cody J. Gleason, Solon, OH (US); John J. Maloney, Solon, OH (US); Srinivasan Sridharan, Strongsville, OH (US); George E. Sakoske, Independence, OH (US); Peter Marley, Farmington, NY (US); Mohammed H. Megherhi, Victor, NY (US); Yie-Shein Her, Canandaiugua, NY (US); Orville W. Brown, Escondido, CA (US); Jackie D. Davis, Cleveland, OH (US); Thomas J. Coffey, Cleveland Heights, OH (US); Ellen S. Tormey, Princeton Junction, NJ (US); Stanley Wang, Taipei (TW); David L. Widlewski, Parma Heights, OH (US)

(73) Assignee: Ferro Corporation, Mayfield Heights, OH (US)

( * ) Notice: Subject to any disclaimer, the term of this patent is extended or adjusted under 35 U.S.C. 154(b) by 0 days.

(21) Appl. No.: 16/180,096

(22) Filed: Nov. 5, 2018

(65) Prior Publication Data

US 2019/0135683 A1    May 9, 2019

Related U.S. Application Data

(60) Provisional application No. 62/582,343, filed on Nov. 7, 2017.

(51) Int. Cl.

| | |
|---|---|
| *C03C 14/00* | (2006.01) |
| *C03C 4/16* | (2006.01) |
| *C03C 10/00* | (2006.01) |
| *C03C 3/118* | (2006.01) |
| *C04B 35/14* | (2006.01) |
| *H01L 23/15* | (2006.01) |
| *C03B 19/00* | (2006.01) |
| *C03C 12/00* | (2006.01) |
| *H05K 1/03* | (2006.01) |

(52) U.S. Cl.
CPC .......... *C03C 10/0027* (2013.01); *C03B 19/00* (2013.01); *C03C 3/118* (2013.01); *C03C 4/16* (2013.01); *C03C 12/00* (2013.01); *C03C 14/004* (2013.01); *C04B 35/14* (2013.01); *H01L 23/15* (2013.01); *C03C 2214/04* (2013.01); *C04B 2235/3203* (2013.01); *C04B 2235/3206* (2013.01); *C04B 2235/3217* (2013.01); *C04B 2235/3225* (2013.01); *C04B 2235/3232* (2013.01); *C04B 2235/3234* (2013.01); *C04B 2235/3244* (2013.01); *C04B 2235/3284* (2013.01); *C04B 2235/3409* (2013.01); *C04B 2235/3436* (2013.01); *C04B 2235/3472* (2013.01); *C04B 2235/3481* (2013.01); *C04B 2235/36* (2013.01); *C04B 2235/365* (2013.01); *C04B 2235/3826* (2013.01); *C04B 2235/3873* (2013.01); *C04B 2235/445* (2013.01); *C04B 2235/447* (2013.01); *C04B 2235/5436* (2013.01); *C04B 2235/5445* (2013.01); *C04B 2235/5454* (2013.01); *C04B 2235/77* (2013.01); *C04B 2235/80* (2013.01); *C04B 2235/9607* (2013.01); *H05K 1/0306* (2013.01)

(58) Field of Classification Search
CPC .............................. C03C 14/004; C03C 4/16
See application file for complete search history.

(56) References Cited

U.S. PATENT DOCUMENTS 7,144,833 B2 *  12/2006  Umemoto ............... B32B 18/00
                                                501/32

FOREIGN PATENT DOCUMENTS

JP       2010260781 A  *  11/2010
JP       2011105555 A  *   6/2011

* cited by examiner

*Primary Examiner* — Karl E Group
(74) *Attorney, Agent, or Firm* — Rankin, Hill & Clark LLP

(57) ABSTRACT

A low K value, high Q value, low firing dielectric material and method of forming a fired dielectric material. The dielectric material can be fired below 950° C. or below 1100° C., has a K value of less than about 8 at 10-30 GHz and a Q value of greater than 500 or greater than 1000 at 10-30 GHz. The dielectric material includes, before firing a solids portion including 10-95 wt % or 10-99 wt % silica powder and 5-90 wt % or 1-90 wt % glass component. The glass component includes 50-90 mole % $SiO_2$, 5-35 mole % or 0.1-35 mole % $B_2O_3$, 0.1-10 mole % or 0.1-25 mole % $Al_2O_3$, 0.1-10 mole % $K_2O$, 0.1-10 mole % $Na_2O$, 0.1-20 mole % $Li_2O$, 0.1-30 mole % F. The total amount of $Li_2O+Na_2O+K_2O$ is 0.1-30 mole % of the glass component. The silica powder can be amorphous or crystalline.

17 Claims, 5 Drawing Sheets

LOW K DIELECTRIC COMPOSITIONS FOR HIGH FREQUENCY APPLICATIONS

FIELD

The present subject matter relates to dielectric compositions that can be sintered at 1100° C., 950° C. or 900° C. or below, and once fired produces a dielectric component having a low dielectric constant K (i.e., the relative permittivity of a dielectric material) of less than or equal to 4, or less than or equal to 6, or less than or equal to 8, and has a Q value of the system of greater than 500 or greater than 1,000, and is useful for high frequency applications, such as wireless, mobile (2-27 GHZ) automotive radars for smart cars (77-80 GHZ), and low temperature co-fired ceramic (LTCC) applications.

BACKGROUND

In communication applications, dielectric materials with a high quality factor (Q) are desired for making a dielectric layer, because high Q materials have a low rate of energy loss, and therefore oscillations generated in the material last longer without losing the strength. The Q factor of a dielectric material is $1/\tan \theta$ where $\tan \theta$ is the dielectric loss tangent. There is growing demand for dielectric materials with very high Q values greater than 500 or greater than 1,000 for high frequency applications.

High Q materials are generally based on crystalline oxide materials, which sinter at high temperatures of greater than 1000° C. or greater than 1100° C.; for example, titanate powders, which have a K value of greater than about 20. Lower K materials are sought after in electronics industry, including in microelectronics industry, which requires materials with lower signal loss (which is proportional to dielectric constant) or lower delay, as well as reduced cross talk between two conductor lines. Here the requirements are for K less than about 6, preferably less than 4 (even less than 3.8). For this purpose, a number of high Q, low K oxide ceramic materials exist, such as silica (K~3.8), β-eucryptite ($LiAlSiO_4$) (K~4.8), sillimanite ($Al_2O_3.SiO_2$) (K~5.3), albite ($NaAlSi_3O_8$) (K~5.5), magnesium phosphate ($Mg_2P_2O_7$) (K~6.1), aluminum phosphate ($AlPO_4$) (K~6.1), cordierite ($2MgO.2Al_2O_3.5SiO_2$) (K~6.2) and willemite ($2ZnO.SiO_2$) (K~6.6), wherein the symbol "~" means "approximately equal to". However, these crystalline oxide materials have very high sintering temperatures (e.g. greater than 1000° C. or greater than 1100° C.), and may therefore not be compatible with co-firing with other components of an electronic assembly, e.g. silver conductors that are present in electrical assemblies that have a melting temperature of about 960° C.

There are some state of the art LTCC materials with K of 4-12 based on glass added to dielectric systems. The addition of traditional low softening temperature glasses, e.g. ZnO—B2O3-SiO2 glass, to these low K materials can lower the sintering temperature, e.g. less than 1100° C., 950° C. or 900° C., so that it is below the melting temperature of silver conductors that are present in electrical assemblies. However, such addition of traditional glasses also results in either bringing down the Q value, or increasing their dielectric constants of these low K materials, and if not enough glass is added, then the sintering temperature remains high, e.g. above 1100° C., or above 950° C. Accordingly, these systems including glass, and depending on how much glass is added to the system, may suffer from having a K of greater than 4, having a reduced Q value, or have higher sintering temperatures of greater than 950° C., or even greater than 1000° C., or even greater than 1100° C. Because of this, it is quite difficult to produce a material that has a high Q, a K value of less than 4 when measured at high frequencies, and a sintering temperature lower than 900° C. Therefore there exists a need to develop an improved low K dielectric compositions for high frequency applications.

In the state of the art, organic based substrates like FR-4 printed circuit board materials or (CVD or PVD) grown fluorinated glass (SiOF) inorganic glassy materials are used. Even for these materials however, making them in bulk form (e.g. a stand-alone bulk resonator) is not possible with traditional casting or sintering approaches. Moreover, these materials generally operate at lower frequencies (in low MHz) rather than at higher frequencies, cannot handle higher service temperatures, higher energy densities, and have lower mechanical strength.

As such, there is a need to provide improved compositions that address the shortcomings of the previous dielectric materials.

SUMMARY

The difficulties and drawbacks associated with previously known compositions are addressed in the present compositions, methods, and systems.

In one aspect, the present subject matter provides sintered dielectric material comprising before sintering, a solids portion including silica powder at 10-99 wt % or at 10-95 wt %, and a glass component (or frits) at 1-90 wt % or at 5-90 wt %. The glass component includes 50-90 mole % $SiO_2$, 5-35 mole % or 0.1-35 mole % $B_2O_3$, 0.1-10 mole % or 0.1-25 mole % $Al_2O_3$, 0.1-10 mole % $K_2O$, 0.1-10 mole % $Na_2O$, 0.1-20 mole % $Li_2O$, 0.1-30 mole % F. The total amount of $Li_2O+Na_2O+K_2O$ is 0.1-30 mole % of the glass component. The sintered dielectric material has a dielectric constant less than 8 and a Q value of greater than 500 when sintered at less than 1100° C. Although not wishing to be bound by theory, it is believed that heavier alkali ions such as $Cs^+$, $Rb^+$ are not generally as effective as lighter alkali ions ($Li^+$, $Na^+$, $K^+$) in reducing the K value, in principle these heavier alkali ions (for example provided in the form of $Cs_2O$, $Rb_2O$) could still be added to reduce the K value in preference to heavier alkali earth oxides such as SrO, BaO, which may increase the K value.

In another aspect, the present subject matter provides a method of forming a dielectric component, comprising providing a dielectric composition including a solids portion, the solids portion including 10-95 wt % or 10-99 wt % silica powder having a D-50 particle size of 0.5-30 μm, and 5-90 wt % or 1-90 wt % glass component. The glass component includes 50-90 mole % $SiO_2$, 5-35 mole % or 0.1-35 mole % $B_2O_3$, 0.1-10 mole % or 0.1-25 mole % $Al_2O_3$, 0.1-10 mole % $K_2O$, 0.1-10 mole % $Na_2O$, 0.1-20 mole % $Li_2O$, 0.1-30 mole % F. The total amount of $Li_2O+Na_2O+K_2O$ is 0.1-30 mole % of the glass component. The method includes heating the dielectric composition to 800-950° C. or 700-900° C. or 700-950° C. or 700-1100° C. for 10-10000 minutes in order to sinter the solids portion and thereby form the dielectric component. The dielectric component has a dielectric constant less than 8 and a Q value of greater than 500.

As will be realized, the subject matter described herein is capable of other and different embodiments and its several details are capable of modifications in various respects, all without departing from the claimed subject matter. Accord-

BRIEF DESCRIPTION OF THE DRAWINGS

FIG. 5 is a photograph of a fired dielectric material similar to Example 1 except including quartz instead of fused silica in accordance with the present subject matter.

FIG. 6 is a photograph of a fired dielectric material similar to Example 1 except including cristobalite instead of fused silica in accordance with the present subject matter.

DETAILED DESCRIPTION OF THE EMBODIMENTS

Figure 1:
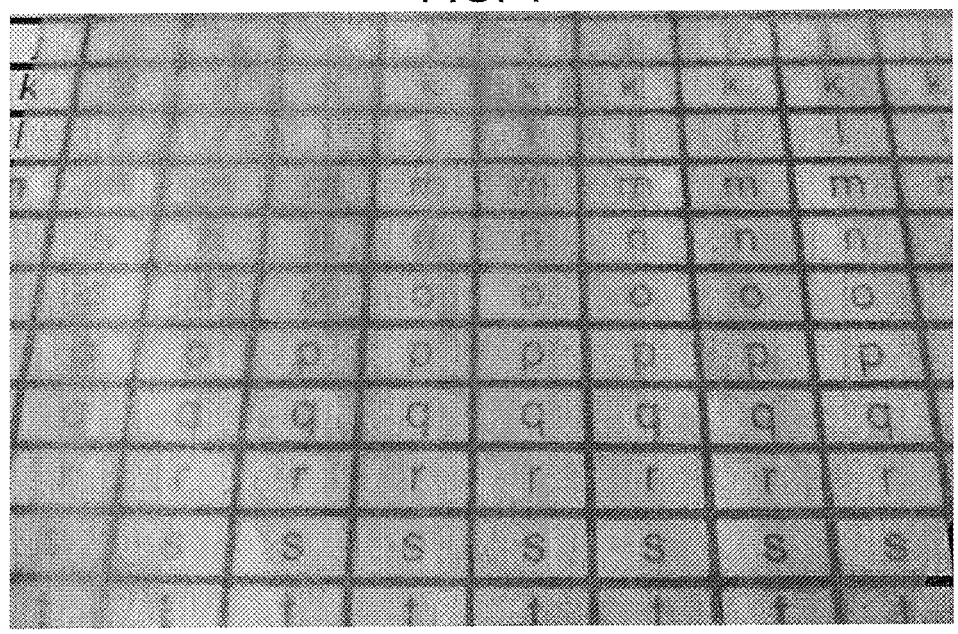
FIG. 1 is a photograph of a fired dielectric material of Example 1 in accordance with the present subject matter.

The present invention relates to low K dielectric compositions that can be fired to greater than 90% theoretical density at temperatures less than about 1100° C., or less than about 1000° C., or less than about 950° C. peak temperatures, or more preferably less than 900° C. The dielectric composition has a K value of less than or equal to 8 (e.g. K=2-8), or less than 6 (e.g. K=2-6), preferably less than 4.0 (e.g. K=2-4.0), more preferably less than 3.8 (e.g. K=2-3.8), and most preferably less than 3.5 (e.g. K=2-3.5) when measured at 5-75 GHz or at 10-30 GHz; while maintaining high Q values, for example Q values of greater than 500, 1000, 2000, 5000, 10000, 15000, 20000, 30000, 40000, or 50000, or any value between the foregoing, or even greater when measured at higher GHz frequencies.

The inventive dielectric compositions are suitable for low dielectric constant dielectrics based electrical components such as resonators, band pass filters, oscillators, antennas (conventional & small antenna and their miniaturization), and LTCC substrates, and are suitable for other high frequency applications involving microwave frequencies 300 MHz-300 GHz, including at 850-1900 MHz for Quad-band GSM applications, 2400 MHz for blue tooth & Wi-Fi applications, and greater than 1 GHz, more preferably greater than 10 GHz, most preferably in mm waves of 30 GHz to 300 GHz; particularly at approximately 27 GHz for wireless communication, at 54-66 GHz for broadband wireless transmission, at 77-79 GHz for band high speed wireless transmissions, at 54-66 GHz and 77-79 GHz bands for in-vehicle radar communication, and even into the THz frequencies. Additionally the fired dielectric compositions have low loss within the system, as reflected in the loss tangent value being less than 0.004, 0.002, 0.001, 0.0005, or 0.0001.

The dielectric components formed from sintering the dielectric compositions may be used for telephone communication, in the radar industry, robotics, medical devices, smart appliances, smart cars, energy conversion and storages, 4G LTE applications, 5G applications, m2m (machine to machine communication), and emerging IoT (Internet of Things) applications.

In the microelectronics industry for example, low K materials are used to produce lower signal loss (which is proportional to the dielectric constant K of the material) and less delay, as well as to be able to reduced cross talk between two conductor lines. The K values of these material are desired to be less than about 4, or less than about 3.8. In the state of the art materials, either organic based substrates like FR-4 grade of printed circuit board material, or chemical vapor deposition (CVD) or physical vapor deposition (PVD) grown fluorinated inorganic glassy materials (SiOF) are used. However, even for these materials, making them into a bulk form (e.g. a stand-alone bulk resonator) rather than a coating, is not possible using traditional tape casting or bulk sintering approaches, and these conventional materials generally operate at lower frequencies (in low MHz). However, the inventive low K dielectric compositions perform well at higher frequencies and can be used as a low loss bulk substrate, such as LTCC or ULTCC (Ultra Low Temperature Co-fired Ceramics) for high frequency applications.

Furthermore, the wireless communication, mobile communication, internet and connectivity fields require materials that operate high frequencies of greater than 300 MHz, even up to microwave or mm wave frequencies of 300 MHz-300 GHz, and may even extend into THz frequencies in the future. The present low K materials provide faster transmission rates with reduced or no loss of energy. Since resonant frequencies (fr), i.e. operating frequencies, is inversely related to the size of the resonator (d), and dielectric constant (K) of the material forming the resonator, the present low K materials will allow for higher operating frequencies because they have a higher quality factor (Q) of greater than 1000 at these operating (resonant) frequencies. The materials thus give faster transmission rates, reduced delay time (or latency) and excellent quality of signals because of lower loss. The present low K, high Q materials perform well at higher frequencies and are therefore well suited for wireless applications, radar communications and low latency (quick transmission and receiving of signals) applications.

Additionally, the present invention includes various application and forming techniques that allow for producing various sizes (d) of the dielectric component made from the sintered dielectric material. That is, the dielectric component can be made to have a size that is relatively large (e.g. a bulk or stand-alone dielectric component) down to a size that is very small (e.g. a micron or sub-micron sized dielectric trace formed on a substrate) depending on the application/forming techniques.

The feature size (d) of the dielectric component can be controlled, in order of decreasing size, by using certain productions techniques including dry pressing, tape casting, syringe depositing, screen printing, digital or ink jet printing, micro spray, hot pressing, cold sintering, sol-gel deposition, tape casting, and extrusion deposition. In this way, electronic devices incorporating these low K dielectric components can operate at higher and higher frequencies as the size (d) of the dielectric components decreases. For these purposes and for these production methods, the dielectric material before sintering, may include a solids portion with average particle sizes from about 10 nanometers (nm) and up, 100 nm up to 30 microns (μm), and in particular applications from 3 micron (μm) up to 30 μm for dry pressing of the solids portion; less than 1-3 μm for tape casting, 0.5-3 μm for screen printing, and 0.1-1 μm, preferably 0.1-0.8 μm, more preferably 0.1-0.5 μm for ink jet or digital printing.

Due to their low sintering temperatures of less than 1100° C., 950° C. or 900° C., these low K dielectric materials are co-fireable with other electronic components, most notably inductors and conductors. Co-firing the dielectric material may involve matching characteristics of the dielectric material with those of the co-fired materials, for example matching the peak firing temperature, thermal expansion (to reduce warpage), and shrinkage when the dielectric materials are processed as tapes (again to reduce warpage). In one embodiment, the composition of the dielectric composition can be varied so as to provide low K materials with differing Coefficients of Thermal Expansion (CTE), while maintaining a relatively constant K and Q values.

In accordance with the present subject matter, the porosity of the sintered dielectric material can be controlled in order to lower the K value. The porosity of the sintered dielectric material can be controlled by including particles in the solids portion from 0.1-10 wt % and having an average particle size of from 100 nm to 30 μm or from 10 nm to 30 μm. The particles can include hollow glass powders or particles, hollow silica spheres, porous silicate glasses, porous organo silicate glasses, xerogel particles, aerogel particles, polysiloxane, zeolite particles, hollow ceramic spheres, mica particles, materials that release chemically bound $O_2$ or bound water when heated to certain temperatures, or other porous particles.

The K value may also be lowered by including in the dielectric material, an oxy fluoride glass having low atomic weight cations such as $Li^+$, $B^{3+}$, $Si^{4+}$, $Al^{3+}$ or by including carbon containing glass composite particles, such as sol gel derived borosilicate glasses having different degrees of carbon in their structure to have low polarizable C—O, C—H, —F, C—F bonds in the structure. Additionally, low weight ions such as $Be^+$, $Cl^-$, $Br^-$, $N^{3-}$, $I^-$ can be included.

The present subject matter also includes providing slightly higher K materials (e.g. K less than or equal to 6, or K less than or equal to 8) but with superior Q values, and sintering temperature still below 1100° C., 950° C. or 900° C., by incorporating one or more ceramic materials into the composition of this invention, such as β-eucryptite, sillimanite, lithium calcium silicate, albite, lithium aluminum borate, magnesium phosphate, aluminum phosphate, cordierite, willemite, gahnite, mullite, wollastonite, calcium borate, forsterite, aluminum borate, aluminum silicate, and alumina, which can provide a K value of less than or equal to 4, or less than or equal to 6, or less than or equal to 8.

Silica ($SiO_2$) is a low K and very stable oxide material. However, by itself, silica sinters at temperatures well above 1100° C., and therefore silica needs to be combined with lower firing material, such as a sintering aid glass, to lower the sintering to temperatures below 1100° C., 950° C. or 900° C. Fluorides, such as $MgF_2$ or LiF, may be used as sintering aids to lower the sintering temperatures below 1100° C., 950° C. or 900° C. However, even though fluorides may lower the sintering temperature, is was found that the fired dielectric material may not have a lower K value. Instead the fired dielectric material became weak due to uncontrolled porosity. However, with a glass and $SiO_2$ additions, sintering temperature was lowered with LiF addition but excessive amount of bubbles remained in the sample. Oxides that lower the sintering temperature, such as $B_2O_3$, ZnO, $V_2O_5$, $Tl_2O$, $TeO_2$ for example, and $H_3BO_3$ additives may be used, but these may not produce sufficiently dense and strong dielectric structures. Other additives such as hydrates, borates (boric acid), halides and sulfides can be added in small quantities.

The present subject matter relates to a sintered dielectric material, comprising before firing a solids portion including silica powder at 10-99 wt %, 10-95 wt %, 15-90 wt %, 20-85 wt %, 30-75 wt %, or 40-65 wt %; and glass component at 1-90 wt %, 5-90 wt %, 10-85 wt %, 15-80 wt %, 25-70 wt %, or 35-60 wt %. The glass component can comprise $BaO$—$B_2O_3$—$SiO_2$ glass frit, $CaO$—$B_2O_3$—$SiO_2$ glass frit, $MgO$—$B_2O_3$—$SiO_2$ glass frit, $SrO$—$B_2O_3$—$SiO_2$ glass frit, $ZnO$—$B_2O_3$—$SiO_2$ glass frit, $B_2O_3$—$SiO_2$ glass frit, alkali borosilicate glass frit, and $BaO$—$SiO_2$, $CaO$—$SiO_2$, $MgO$—$SiO_2$, $SrO$—$SiO_2$, $ZnO$—$SiO_2$ glass frits, Borate glass frit, boro-alumino-silicate glass frit, alkaline earth borosilicate glass frit, for example along with fluoride, chloride, bromide, iodide additives. The glass component can be a combination of two or more different glass frits.

In terms of selection of glasses for high frequency application, ionic and electronic polarizations may influence the loss mechanisms, i.e. lower the Q values. Therefore, these components of polarization may be minimized in order to produce higher Q values. Ionic and electronic polarization may be reduced by using lower weight cations (e.g. $Li^+$) and by keeping the alkali oxides content low (in fact all other modifier oxide ions low) to reduce the amount of non-bridging oxygens in the glass component, which could lead to more (anionic) polarization loss. However, when using borosilicate glass frit, all alkali oxides cannot be eliminated since some is needed to avoid phase separation and to keep the softening point of the glass at less than 750° C. to keep the sintering temperatures at less than 1100° C., 950° C., or 900° C.

One other source of energy loss in materials, especially in crystals and glass, is resonance of phonon waves in the material under high frequency. While not being bound to any particular theory, it is believed that the interaction of silica powder (amorphous or crystalline) with the glass during firing produces coherence (i.e. minimizing of interfaces) between glass frit and silica particles and increases the wavelength of resonance creating phonon waves, essentially negating the presence of phonon waves in the high frequency region of 300 MHz to 300 GHz. In this way, the microstructure of the dielectric material allows the dielectric material to have lower K and higher Q values due to the absence of this resonant phonon waves in this high frequency region.

Glass Component

The sintered dielectric material can include before firing, a glass component at 1-90 or 5-90 or 15-80 or 25-70 or 35-60 or 45-50 wt %. The glass component can include an alkali borosilicate glass component comprising before firing 50-90 or 60-80 or 65-75 mole % $SiO_2$; 0.1-35 or 5-35 or 10-30 or 15-25 mole % $B_2O_3$; 0.1-25 or 0.1-10 or 5-15 mole % $Al_2O_3$; 0.1-10 or 1-8 or 2-7 mole % $K_2O$; 0.1-10 or 1-8 or 2-7 mole % $Na_2O$; 0.1-20 or 5-15 or 7.5-12.5 mole % $Li_2O$; 0.1-30 or 5-25 or 10-20 mole % F; and the total amount of $Li_2O+Na_2O+K_2O$ is 0.1-30 or 5-25 or 10-20 mole % of the glass component. One suitable glass component is EG2790, which is commercially available glass frit from Ferro Corporation. When combined with silica powders and sintered at below 1100° C., 950° C. or 900° C. for 30 minutes or 20-40 minutes, the sintered dielectric material may provide K values of 3.1 to 3.5, or 3.3 to 3.8, and higher Q values of greater than 2000 at 10 to 20 GHz.

In this particular glass EG2790, a certain combination of $Li_2O$, $Na_2O$, $K_2O$ exists, which could lead to a mixed alkali effect that lowers the overall non-bridging oxygens. Since there are no appreciable amounts of mobile alkali ions and transition elements ions in the glass, the energy loss under the high electric field due to drift current of the incoming radiation is minimized The unfired dielectric composition can also include one or more other glass frits selected from bismuth glass frit (Tables 1), or a zinc glass frit (Table 2) or alkali titanium silica glass frit (Table 3) or an alkaline earth glass frit (Tables 4A-4E) such as an alkaline earth glass frit, e.g. a magnesium borate silicate glass frit or magnesium borate glass frit, in order to optimize desired properties without unduly affecting K and Q values.

The glass component can include two distinct glass components (e.g. two separate frits). In a non-limiting example, the glass component includes two glasses of a magnesium/boron/silicate glass and a magnesium/aluminum/silicate glass. Additionally, lead-based glasses can optionally be added to lower the firing temperature.

TABLE 1

$Bi_2O_3$—$B_2O_3$—$SiO_2$ oxide glass frit components

| Oxide Mole % | Glass Composition | | |
|---|---|---|---|
| | I | II | III |
| $Bi_2O_3$ | 5-85 | 10-75 | 12-50 |
| $B_2O_3 + SiO_2$ | 5-75 | 15-75 | 34-71 |
| $Li_2O + Na_2O + K_2O$ | 0-40 | 5-30 | 10-30 |
| ZnO | 0-55 | 0-20 | 0-12 |
| $TiO_2 + ZrO_2$ | 0-20 | 0-10 | 1-6 |
| $Al_2O_3$ | 0-25 | 0-15 | 0.1-10 |

TABLE 2

ZnO—$B_2O_3$—$SiO_2$ based glass frit components

| Oxide Mole % | Glass Composition | | |
|---|---|---|---|
| | IV | V | VI |
| ZnO | 5-65 | 7-50 | 10-32 |
| $SiO_2$ | 10-65 | 20-60 | 22-58 |
| $B_2O_3$ | 5-55 | 7-35 | 10-25 |
| $Al_2O_3$ | 0-25 | 0-15 | 0.1-10 |

TABLE 3

Alkali oxides-$TiO_2$—$B_2O_3$—$SiO_2$ glass frit

| Oxide Mole % | Glass Composition | | |
|---|---|---|---|
| | VII | VIII | IX |
| $Li_2O + Na_2O + K_2O + Cs_2O + Rb_2O$ | 5-55 | 15-50 | 30-40 |
| $TiO_2 + ZrO_2$ | 2-26 | 10-26 | 15-22 |
| $B_2O_3 + SiO_2$ | 5-75 | 25-70 | 30-52 |
| $TeO_2 + V_2O_5 + Sb_2O_5 + P_2O_5$ | 0-30 | 0.25-25 | 5-25 |
| MgO + CaO + BaO + SrO | 0-20 | 0-15 | 0-10 |
| F | 0-20 | 0-15 | 5-13 |
| $Al_2O_3$ | 0-25 | 0-15 | 0.1-10 |

TABLE 4A

Alkaline earth oxides- $B_2O_3$—$SiO_2$ glass frit.

| Oxide Mole % | Glass Composition | | |
|---|---|---|---|
| | X | XI | XII |
| BaO | 0-75 | 0-66 | 0-65 |
| CaO | 0-75 | 0-66 | 0-65 |
| SrO | 0-75 | 0-66 | 0-65 |
| MgO | 0-75 | 0-66 | 0-65 |
| (BaO + CaO + SrO + MgO) | 15-75 | 25-66 | 50-65 |
| $B_2O_3 + SiO_2$ | 5-75 | 20-55 | 24-45 |
| ZnO | 0-55 | 0.1-35 | 0.1-25 |
| $Li_2O + Na_2O + K_2O + Cs_2O + Rb_2O$ | 0-40 | 0-30 | 0-10 |
| $TiO_2 + ZrO_2$ | 0-20 | 0-10 | 0.1-5 |
| $Al_2O_3$ | 0-25 | 0-15 | 0.1-10 |

TABLE 4B

MgO—$B_2O_3$—$SiO_2$ glass frit.

| Oxide Mole % | Glass Composition | | |
|---|---|---|---|
| | XIII | XIV | XV |
| BaO | 0-75 | 0-66 | 0-65 |
| CaO | 0-75 | 0-66 | 0-65 |
| SrO | 0-75 | 0-66 | 0-65 |
| MgO | 15-75 | 25-66 | 50-65 |
| $B_2O_3 + SiO_2$ | 5-75 | 20-55 | 24-45 |
| ZnO | 0-55 | 0.1-35 | 0.1-25 |
| $Li_2O + Na_2O + K_2O + Cs_2O + Rb_2O$ | 0-40 | 0-30 | 0-10 |
| $TiO_2 + ZrO_2$ | 0-20 | 0-10 | 0.1-5 |
| $Al_2O_3$ | 0-25 | 0-15 | 0.1-10 |

TABLE 4C

CaO—$B_2O_3$—$SiO_2$ glass frit.

| Oxide Mole % | Glass Composition | | |
|---|---|---|---|
| | XVI | XVII | XVIII |
| BaO | 0-75 | 0-66 | 0-65 |
| CaO | 15-75 | 25-66 | 50-65 |
| SrO | 0-75 | 0-66 | 0-65 |
| MgO | 0-75 | 0-66 | 0-65 |
| $B_2O_3 + SiO_2$ | 5-75 | 20-55 | 24-45 |
| ZnO | 0-55 | 0.1-35 | 0.1-25 |
| $Li_2O + Na_2O + K_2O + Cs_2O + Rb_2O$ | 0-40 | 0-30 | 0-10 |
| $TiO_2 + ZrO_2$ | 0-20 | 0-10 | 0.1-5 |
| $Al_2O_3$ | 0-25 | 0-15 | 0.1-10 |

TABLE 4D

SrO—$B_2O_3$—$SiO_2$ glass frit.

| Oxide Mole % | Glass Composition | | |
|---|---|---|---|
| | XIX | XX | XXI |
| BaO | 0-75 | 0-66 | 0-65 |
| CaO | 0-75 | 0-66 | 0-65 |
| SrO | 15-75 | 25-66 | 50-65 |
| MgO | 0-75 | 0-66 | 0-65 |
| $B_2O_3 + SiO_2$ | 5-75 | 20-55 | 24-45 |
| ZnO | 0-55 | 0.1-35 | 0.1-25 |
| $Li_2O + Na_2O + K_2O + Cs_2O + Rb_2O$ | 0-40 | 0-30 | 0-10 |
| $TiO_2 + ZrO_2$ | 0-20 | 0-10 | 0.1-5 |
| $Al_2O_3$ | 0-25 | 0-15 | 0.1-10 |

TABLE 4E

BaO—$B_2O_3$—$SiO_2$ glass frit

| Oxide Mole % | Glass Composition | | |
|---|---|---|---|
| | XXIII | XXIV | XXV |
| BaO | 15-75 | 25-66 | 50-65 |
| CaO | 0-75 | 0-66 | 0-65 |
| SrO | 0-75 | 0-66 | 0-65 |
| MgO | 0-75 | 0-66 | 0-65 |
| $B_2O_3$ + $SiO_2$ | 5-75 | 20-55 | 24-45 |
| ZnO | 0-55 | 0.1-35 | 0.1-25 |
| $Li_2O$ + $Na_2O$ + $K_2O$ + $Cs_2O$ + $Rb_2O$ | 0-40 | 0-30 | 0-10 |
| $TiO_2$ + $ZrO_2$ | 0-20 | 0-10 | 0.1-5 |
| $Al_2O_3$ | 0-25 | 0-15 | 0.1-10 |

Silica

In accordance with the present subject matter, the solids portion also includes 10-99 or 10-95 or 20-85 or 30-75 or 40-65 or 50-55 wt % silica, which can be in powder form and can be amorphous (e.g. fused silica), or crystalline (e.g. quartz, cristobalite, tridymite). These may be in form of hollow silica spheres, xerogel particles, aerogel particles. Use of the various polymorphs of silica does not significantly change the K and Q values of the sintered dielectric material, and such values can be maintained between the various forms of silica used. The use of amorphous or crystalline silica can be chosen based on the desired expansion coefficient of the sintered dielectric material.

In accordance with the present subject matter, the average particle size for the silica powder may be <30 μm; preferably <20 μm; more preferably <10 μm; even more preferably 1-5 μm; and most preferably 0.5-5 μm. The average particle size of the silica powder may be selected depending on the method of making the dielectric component or layer, such as by dry press or tape cast methods. In one embodiment, wherein the dielectric component is formed by digital printing (e.g. ink jet printing), the most preferred average particle size for the silica powder is about 0.5-1.0 μm. While not being bound to any particular theory, it is believe that if the average particle size of the silica powder is too small, then the silica powder will dissolve in the glass component before full sintering is achieved, thus preventing the development of a good microstructure; while having too coarse of particle sizes for the silica powder may cause spontaneous micro cracking around the silica particles, which when the cracks are aligned, can reduce the strength of the dielectric material and sometimes cause spontaneous cracking of the entire dielectric component.

Organic Vehicle

In one embodiment, the dielectric composition is used in LTCC applications, wherein the composition is in the form of a paste. The dielectric material may be in other forms, such as ink for digital printing applications, or different viscosity pastes for screen printing applications, or tapes for tape casting.

The dielectric composition can be obtained by mixing an organic vehicle with the solids portion that includes 10-99 wt % or 10-95 wt % silica powder, and 1-90 w or 5-90 wt % glass component, as disclosed herein. The components of the solids portion (e.g. glass component and silica powder) is generally used in powder form having a mean particle size of about 0.1 to about 10 microns or about 0.5 to about 10 microns, depending on the application or forming technique used to prepare a dielectric material.

The unfired dielectric material include an organics portion, which can include or consist of an organic vehicle. The organic vehicle can include a binder in an organic solvent or in water. The choice of binder used herein is not critical and conventional binders such as ethyl cellulose, polyvinyl butanol, and hydroxypropyl cellulose, and combinations thereof are appropriate together with a solvent. The organic solvent is also not critical and may be selected in accordance with a particular application method (e.g., printing, tape casting, spraying or sheeting), from conventional organic solvents such as butyl carbitol, acetone, toluene, ethanol, diethylene glycol butyl ether; 2,2,4-trimethyl pentanediol monoisobutyrate (Texan®); alpha-terpineol; beta-terpineol; gamma terpineol; tridecyl alcohol; diethylene glycol ethyl ether (Carbitol®), diethylene glycol butyl ether (Butyl Carbitol®) and propylene glycol; and blends thereof, Products sold under the Texanol® trademark are available from Eastman Chemical Company, Kingsport, Tenn.; those sold under the Dowanol® and Carbitol® trademarks are available from Dow Chemical Co., Midland, Mich.

No particular limit is imposed on the organics portion of the dielectric material of the invention. In one embodiment the dielectric material of the invention includes from about 10 wt % to about 40 wt % of the organic vehicle; in another, from about 10 wt % to about 30 wt %. Often the unfired dielectric material contains about 1 to 5 w of the binder and about 10 to 50 w of the organic solvent, with the balance being the solids portion. In one embodiment, the unfired dielectric material of the invention includes from about 60 to about 90 wt % of solids portion, and from about 10 wt % to about 40 wt % of the organics portion. If desired, the unfired dielectric material may contain up to about 10 w of additives such as dispersants, plasticizers, dielectric compounds, and insulating compounds.

Additives

The solids portion may further include an additive that modifies the K value of the fired dielectric material. The K-modifying additive may include crystalline compounds including 0.1-30 wt %, 0.1-20 wt %, or 0.1-10 wt % lithium calcium silicate; 0.1-30 wt %, 0.1-20 wt %, or 0.1-10 wt % β-eucryptite; 0.1-30 wt %, 0.1-20 wt %, or 0.1-10 wt % lithium aluminum borates; 0.1-50 wt %, 0.1-30 wt %, 0.1-20 wt %, or 0.1-10 magnesium aluminum silicates such as $Mg_2Al_4Si_5O_{18}$ (e.g. cordierite); 0.1-30 wt %, 0.1-20 wt %, or 0.1-10 wt % $Al_2SiO_5$ (e.g. sillimanite); 0.1-30 wt %, 0.1-20 wt %, or 0.1-10 wt % $NaAlSi_3O_5$ (e.g. albite); 0.1-30 wt %, 0.1-20 wt %, or 0.1-10 wt % magnesium phosphate; 0.1-50 wt %, 0.1-30 wt %, 0.1-20 wt %, or 0.1-10 wt % aluminum phosphates such as $AlPO_4$; 0.1-30 wt %, 0.1-20 wt %, or 0.1-10 wt % of a compound in the series formula of $(Mg,Fe)_2Al_3(Si_5AlO_{18})$ to $(Fe,Mg)_2Al_3(Si_5AlO_5)$ (e.g. cordierite); 0.1-30 wt %, 0.1-20 wt %, or 0.1-10 wt % $Zn_2SiO_4$ (e.g. willemite); 0.1-30 wt %, 0.1-20 wt %, or 0.1-10 wt % aluminosilicates such as $3Al_2O_3 2SiO_2$ or $2Al_2O_3 SiO_2$ (e.g. mullite); 0.1-30 wt %, 0.1-20 wt %, or 0.1-10 wt % $CaSiO_3$ (e.g. wollastonite); 0.1-30 wt %, 0.1-20 wt %, or 0.1-10 wt % calcium borate; 0.1-30 wt % or 0.1-10 wt % Mg2SiO4 (e.g. forsterite); 0.1-50 wt % or 0.1-30 wt % or 0.1-10 wt % alumina; 0.1-30 wt % or 0.1-10 wt % porous or hollow glass particles; 0.1-50 wt % or 0.1-30 wt % or 0.1-20 wt % aluminoborates such as $9Al_2O_3 2B_2O_3$ or $2Al_2O_3 B_2O_3$; 0.1-30 or 0.1-20 wt % alkali fluorides; 0.1-30 or 0.1-20 wt % alkaline earth fluorides; 0.1-30 or 0.1-20 or 0.1-10 wt % zinc borates such as $ZnOB_2O_3$, $3ZnOB_2O_3$, $5ZnO_2B_2O_3$; 0.1-30 or 0.1-20 or 0.1-10 wt % zinc titanates such as $2ZnO_3TiO_2$, and combinations thereof. These additive can have any morphology, including a spherical morphology, or a non-spherical morphology such as rods, faceted crystals, etc.

The solids portion may further include 0.1-50 wt % of an additive that modifies the strength of the fired dielectric material. The strength-modifying additive may include nano-sized silica ("nano-silica") or colloidal silica, which differs from the 10-99 wt % silica powder previously discussed that has a D50 particle size that is not below 500 nm. The nano-silica may be in powder form and may have a D50 particle size of 5 nm to 500 nm. The strength-modifying additive may also include micro-sized powder with a D50 particle size of less than 10 μm. In a non-limiting example, the micro-sized powder has a D50 particle size of 1-2 μm or 1.5 μm. The micro-sized powder can include one or more of $Al_2O_3$ powder, $ZrO_2$ powder, $TiO_2$ powder, SiC powder, $Si_3N_4$ powder, $Y_2O_3$ powder, MgO powder, or other high-Young's modulus powders and combinations thereof.

Applications for the fired dielectric material include the use as devices such as band pass filters (high pass or low pass), wireless transmitters and receivers for telecommunications including cellular applications, power amplifier modules (PAM), RF front end modules (FEM), WiMAX2 modules, LTE-advanced modules, transmission control units (TCU), electronic power steering (EPS), engine management systems (EMS), various sensor modules, radar modules, pressure sensors, camera modules, small outline tuner modules, thin profile modules for devices and components, and IC tester boards. Band-pass filters contain two major parts, one a capacitor and the other an inductor. Low K material is good for designing the inductor, but may not be suitable for designing a capacitor due the requirement for more active area to generate sufficient capacitance. High K material may result in the opposite. The inventors have discovered that Low K (4-8)/Mid K (10-100) LTCC material can be co-fired and put into a single component, low K materials can be used to design inductor area and high K material can be used to design capacitor area to have optimized performance.

The dielectric material may be co-fired, such as in LTCC applications, with other ceramics such as inductors, capacitors, resistors, and conductors. Conductors can include L8 LTCC Ag conductors (CN33-498, CN33-493, CN33-495) and A6M LTCC Ag conductors (CN33-398, CN33-407, CN33-393). The Ag pastes compositions can be modified to be compatible with the low K dielectric material.

Although the preferred conductor system for the dielectric material of this invention is silver based, both mixed metal based systems such as, but not limited to, AgPd, AgAuPt, more noble metal based pastes such as Au, AuPt, Pt, Au PtPd, copper-based conductors, nickel-based conductors, and low-firing conductors such as aluminum-based conductors can also be used. These conductors can be co-fired with the dielectric material, or post-fired after firing the dielectric material.

The present subject matter includes various processing and formation methods including dry press & sinter, hot press & sinter, cold sinter, sol-gel deposition and firing, tape casting and firing, screen printing and firing, extrusion deposit & firing, and digital printing and firing. When frequency of operation increases from GHz to THz frequencies, the dielectric devices, such as antennas, will likely become miniaturized, thus encouraging the formation of smaller and smaller devices, for example those formed by digitally printing techniques. Firing can be regular furnace firing, fast firing such as laser assisted sintering, or firing by exposure to other electromagnetic radiation.

EXAMPLES

The following examples in Tables 5A-5B are provided to illustrate preferred aspects of the invention and are not intended to limit the scope of the invention.

In order to further assess the various aspects and benefits of the present subject matter, a series of investigations were undertaken to evaluate the dielectric materials and fired dielectric devices formed from the dielectric materials in accordance with the present subject matter. Table 5A below shows desired ranges of glass component oxides, along with the glass component oxides present in Examples 1 and 2 that were prepared in accordance with the present subject matter.

TABLE 5A

| Overall Composition | Most Desired Range | Examples 1 | 2 |
|---|---|---|---|
| | | Mole % | |
| $SiO_2$ | 50-90 | 81.91 | 58.65 |
| $B_2O_3$ | 5-35 | 16.14 | 11.56 |
| $Al_2O_3$ | <10 or <15 | 0.42 | 0.30 |
| $Na_2O$ | <10 | 0.35 | 0.25 |
| $K_2O$ | <10 | 0.46 | 0.33 |
| $Li_2O$ | <20 | 0.72 | 9.99 |
| ($Li_2O + Na_2O + K_2O$) | 0.1 to 30 | 1.53 | 10.57 |
| F | <30 | — | 18.92 |
| Properties | | | |
| K (10 GHz) | | 3.20 | 3.74 |
| K(19.6 GHz) | | 3.35 | |
| K(25 GHz) | | 3.37 | |
| K(27.7 GHz) | | 2.09 | 2.11 |
| K(71.5 GHz) | | 3.64 | |
| Q (10 GHz) | | 6932 | 2698 |
| Q (19.6 GHz) | | 2516 | |

In Table 5A, Example 1 was fired at 900° C. peak temperature for 1 hour and Example 2 was fired at 850° C. peak temperature for 1 hour, and both examples included 3.5 grams of glass component (or frits), and 1.5 grams of amorphous silica. Example 2 additionally included 0.6 grams (about 10 wt %) of LiF, while Example 1 did not include LiF.

Figure 2:
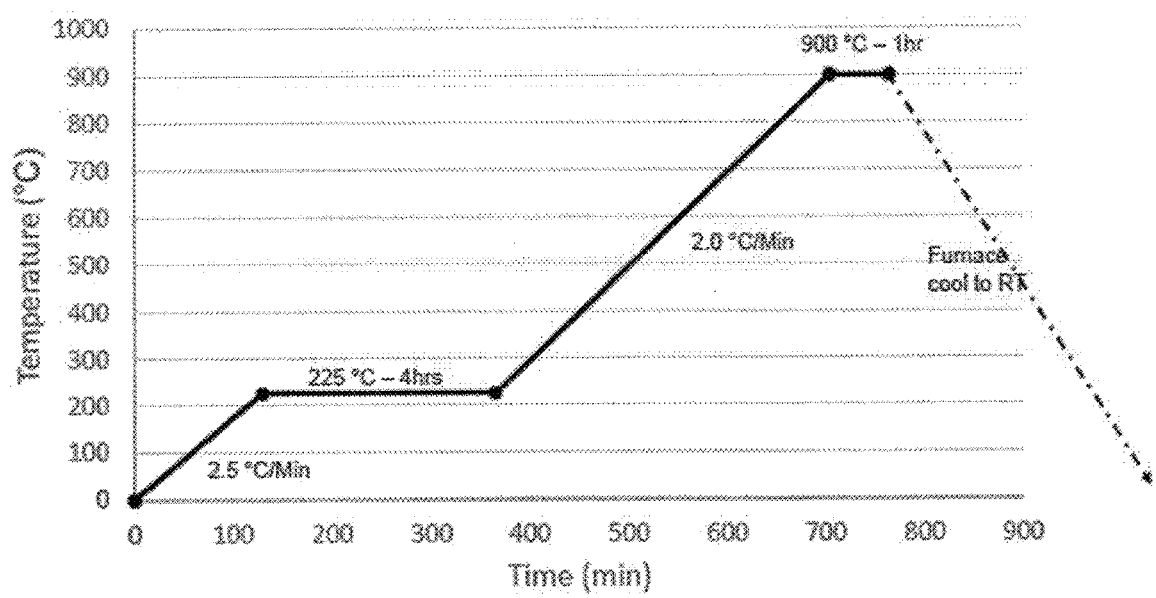
FIG. 2 is a graph showing the firing profile used for producing the fired dielectric material of Example 1.
Figure 3:
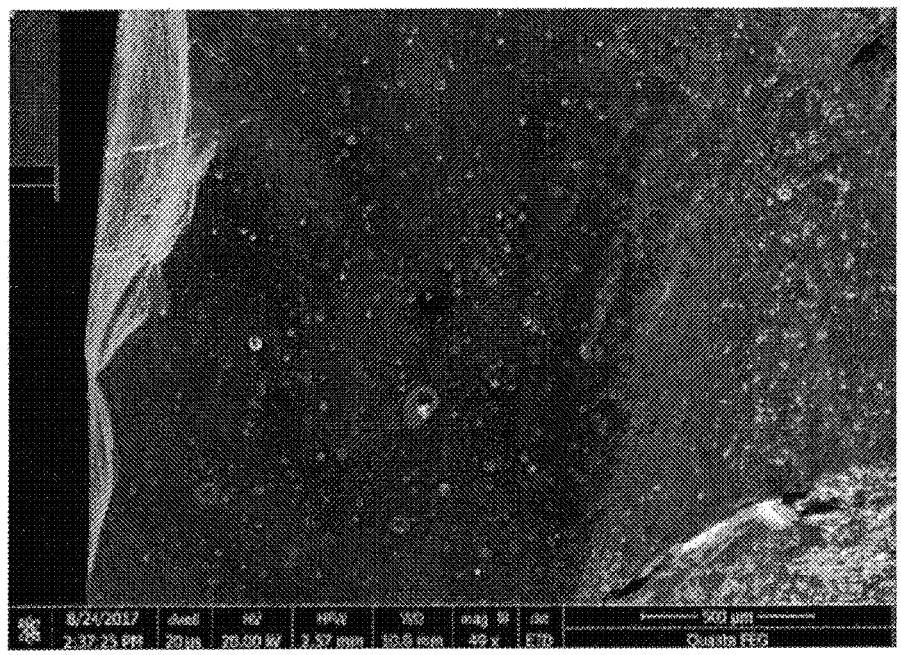
FIGS. 3 and 4 are SEM pictures at different magnifications of the fired dielectric material of Example 1.
Figure 4:
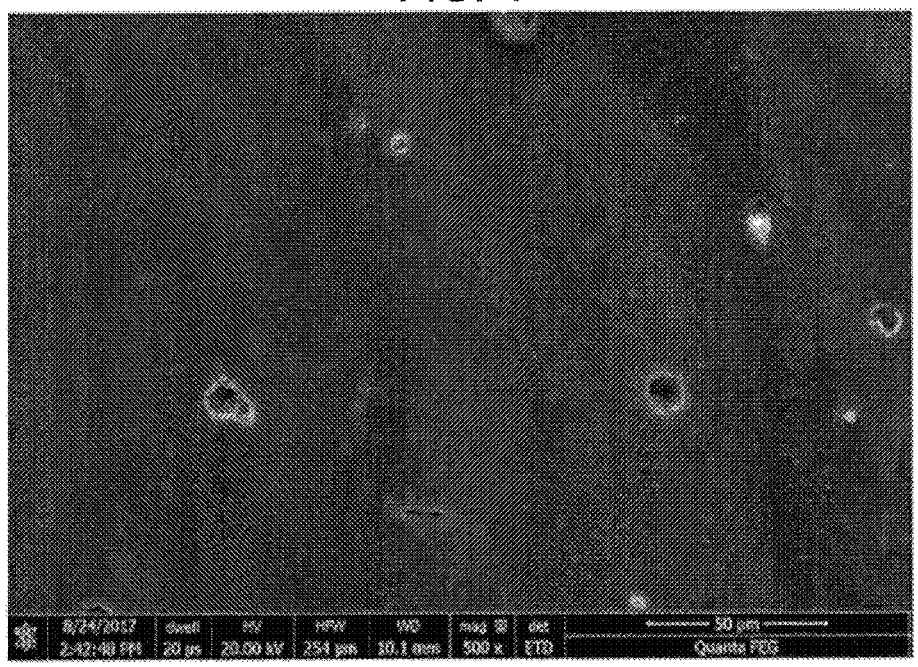

Examples 1 was fired to form transparent dielectric layer as depicted in FIG. 1, which had a thickness of 0.21 mm, a sintered density of 96.4%, an expansion coefficient at 260° C. of $25.2 \times 10^{-7}$/° C., a loss tangent value of $4.07 \times 10^{-3}$, K value of 3.2 at 10 GHz, and a Q value of 6932 at 10 GHZ. The actual firing profile of Example 1 is shown in FIG. 2. An SEM of Example 1 is shown in FIGS. 3 and 4.

Figures 5, 6:
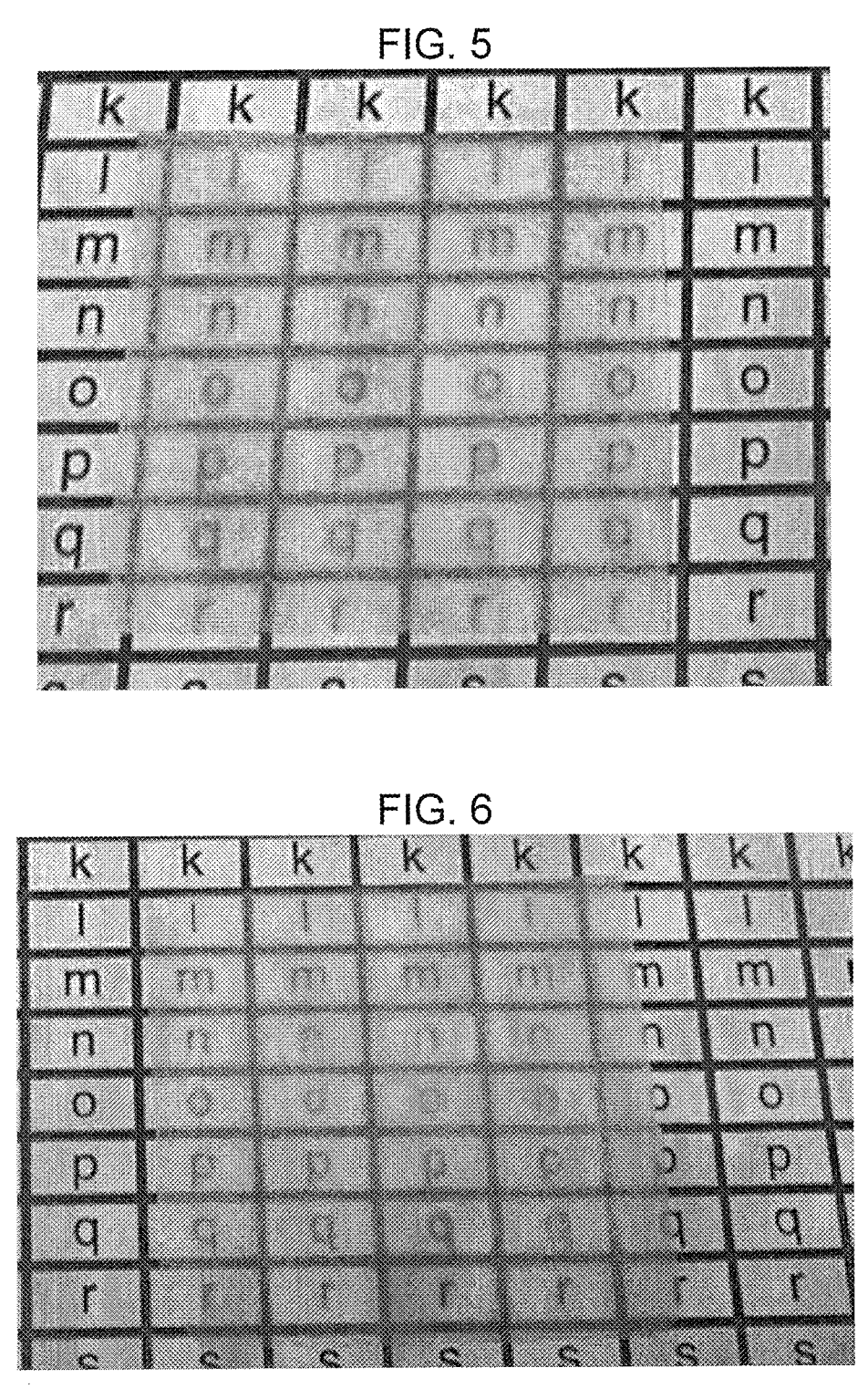

Another investigation was performed, wherein the fused silica of Example 1 was replaced with the same amount (i.e. 30 wt %) of quartz and fired at a peak temperature of 850° C. for 1 hour. The fired dielectric material including quartz produced a transparent, 0.18 mm thick dielectric layer shown in FIG. 5, having expansion coefficient at 260° C. of $64.4 \times 10^{-7}$/° C., a loss tangent value of $3.17 \times 10^{-3}$, K value of 3.15 at 10 GHz, and a Q value of 8421 at 10 GHz. The fused silica of Example 1 was then replaced with the same amount (i.e. 30 wt %) of cristobalite and fired at a peak temperature of 850° C. for 1 hour. The fired dielectric material including cristobalite produced a transparent, 0.18 mm thick dielectric layer shown in FIG. 6, having an expansion coefficient at 260° C. of $124.5 \times 10^{-7}$/° C., a loss tangent value of $2.90 \times 10^{-3}$, K value of 2.90 at 10 GHz, and a Q value of 9412 at 10 GHz.

Figure 7:
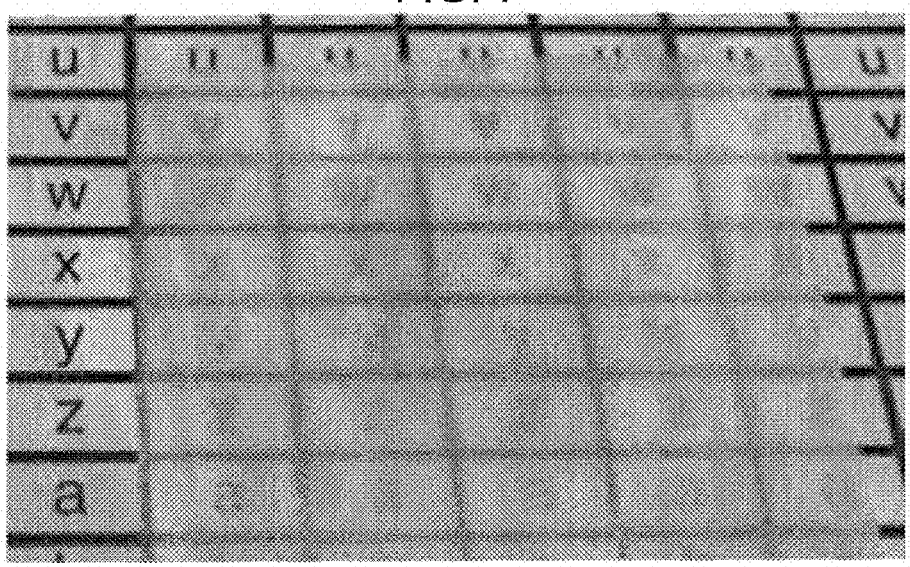
FIG. 7 is a photograph of a fired dielectric material of Example 2 in accordance with the present subject matter.
Figure 8:
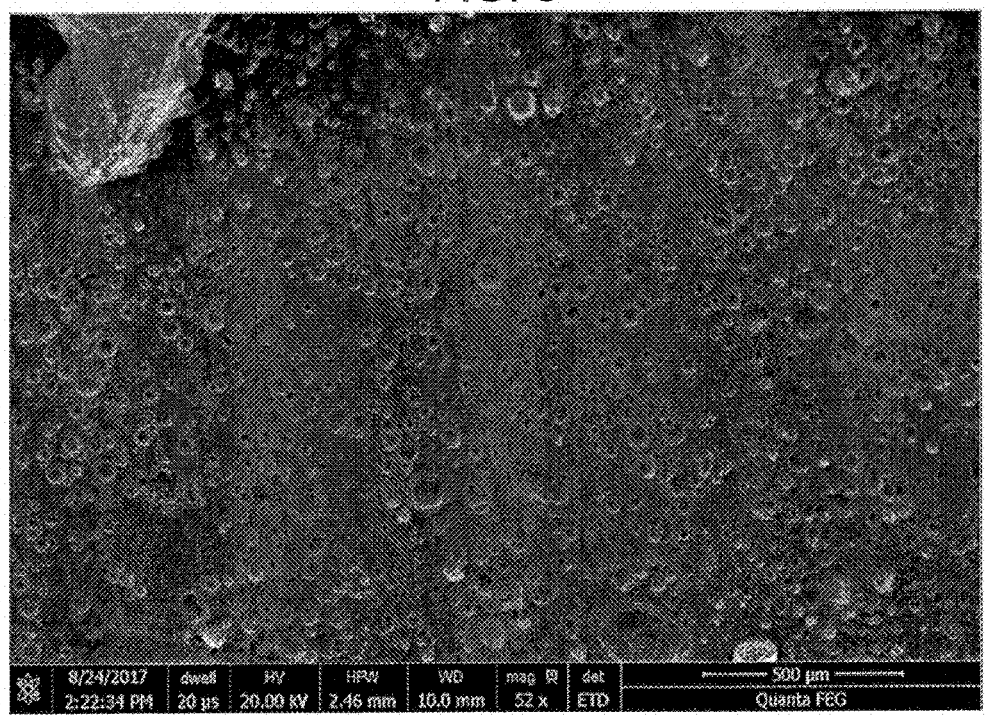
FIGS. 8 and 9 are SEM pictures at different magnifications of the fired dielectric material of Example 2.
Figure 9:
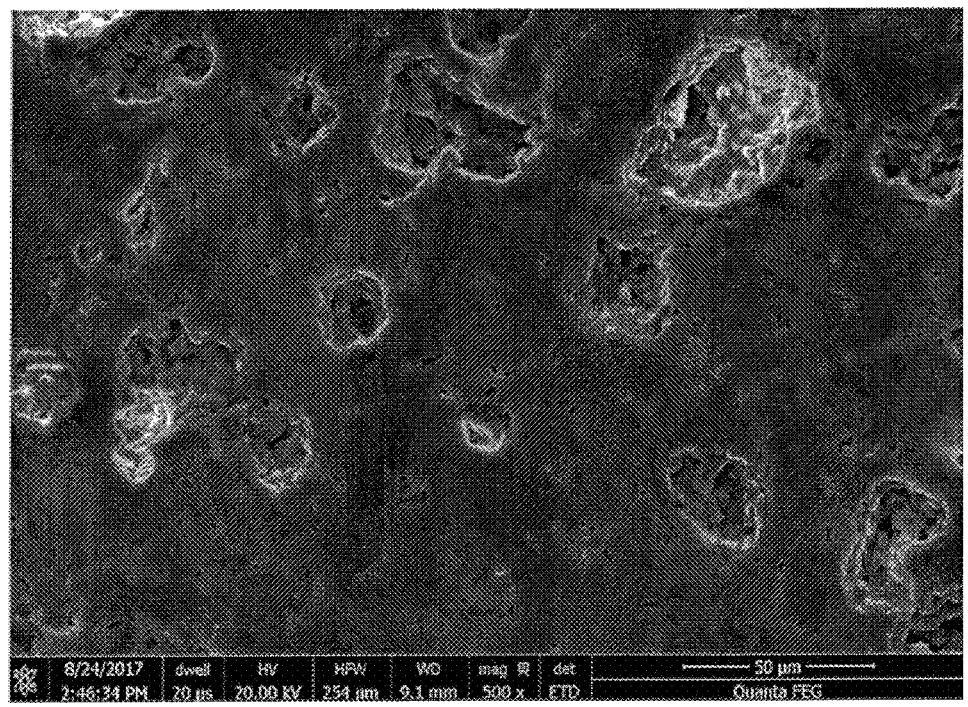

Example 2 was fired at 850° C. to form transparent dielectric layer as depicted in FIG. 7, which had had a thickness of 0.19 mm, and 86.5% sintered density, a Q value of 2697.8 at 10 GHz, a loss tangent value of $1.71 \times 10^{-2}$, and a K value of 3.74 at 10 GHz. SEM images of Example 2 are shown in FIGS. 8 and 9.

Figure 10:
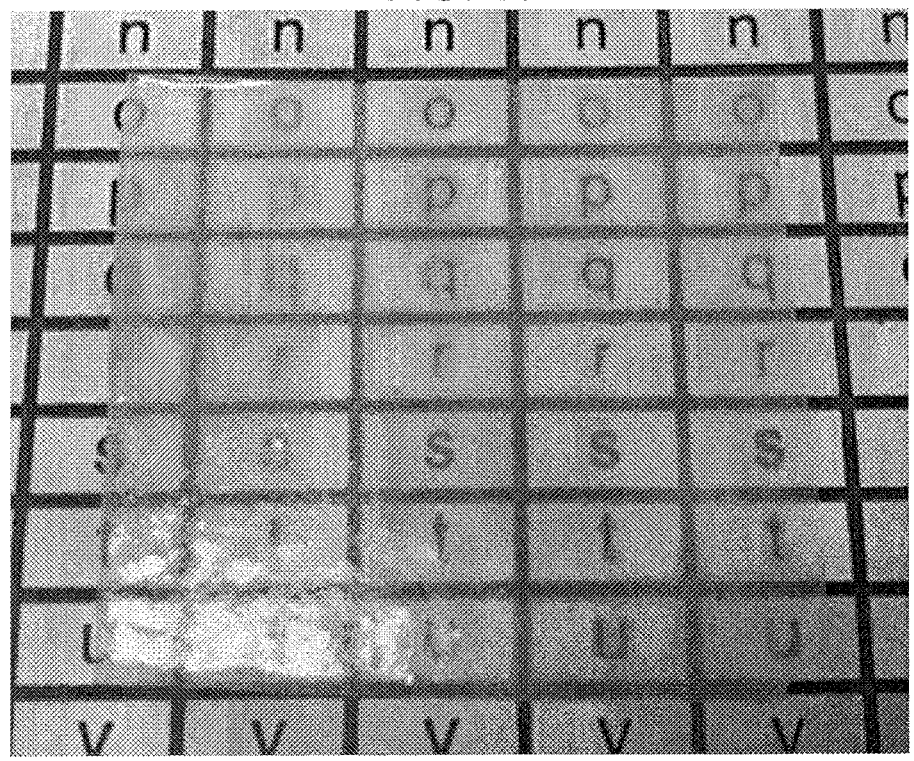
FIG. 10 is a photograph of a comparative example fired dielectric material.

A Comparative Example was prepared by firing a glass component (EG2790 available from Ferro Corporation) only, without any addition of silica powder. The Comparative Example was fired at 700° C. to produce a transparent, 0.16 mm thick dielectric layer shown in FIG. 10, having a Q value of 9021.7 at 10 GHz, a loss tangent value of $2.91 \times 10^{-3}$, and K value of 3.14 at 10 GHz. Although the Comparative Example had a high Q value and low K value, it is believed that silver migration will be greater in the Comparative Example than in the inventive Examples 1 and 2, which can be problematic when co-fired with silver conductors in LTCC applications. Moreover, the addition of different silica powder in Examples 1 and 2 allows for adjustment of coefficient of thermal expansion of the dielectric material.

Apart from the ability to adjust the CTE with additions of different polymorphs of silica (which itself a major consideration when designing the dielectric material so that the CTE of the dielectric material matches that of other material being co-fired with the dielectric material), the additional of silica powder to the glass component may also allow for the ability to A) tailor the shrinkage of the dielectric material during sintering; B) adjust the firing temperature required to sinter the dielectric material so that it matches that of other materials being co-fired with the dielectric material; C) control silver migration through the dielectric material; D) control the size of bubbles in the fired dielectric material in order to control the break down voltage (BDV) of the material; E) control the of level of crystallization in the sintered dielectric material; F) increase the mechanical strength of the sintered dielectric material.

TABLE 5B

| Overall Composition | Most Desired Range | Examples 1 | 3 | 4 |
|---|---|---|---|---|
| | | Mole % | | |
| $SiO_2$ | 50-90 | 81.91 | 73.55 | 64.62 |
| $B_2O_3$ | 5-35 | 16.14 | 18.19 | 17.84 |
| $Al_2O_3$ | <15 | 0.42 | 6.77 | 11.07 |
| $Na_2O$ | <10 | 0.35 | 0.37 | 0.36 |
| $K_2O$ | <10 | 0.46 | 0.73 | 0.72 |
| $Li_2O$ | <20 | 0.72 | 0.39 | 0.38 |
| $(Li_2O + Na_2O + K_2O)$ | 0.1 to 30 | 1.53 | 1.49 | 1.46 |
| F | <30 | — | — | — |
| Properties | | | | |
| K (10 GHz) | | 3.20 | 3.83 | 3.95 |
| Strength (MPa) | | 95.2 | 135.8 | 128.3 |

In Table 5b, Example 3 was fired at 850° C. peak temperature for 1 hour and Example 4 was fired at 900° C. peak temperature for 1 hour, and both examples included 8.8 grams of Example 1. Example 3 additionally included 0.4 grams (about 4 wt %) of nano-silica and 0.8 grams of Al2O3 (about 8 wt %), while Example 4 additionally included 1.2 grams (about 12 wt %) of Al2O3.

As mentioned above increasing the mechanical strength of the sintered dielectric material may be important for robust substrates. Examples 3 and 4 allow for the addition of various strength additives, which when compared to Example 1 show a strength improvement. Example 1 has a strength value of 95.2 MPa whereas Examples 3 and 4 have values of 135.8 MPa and 128.6 MPa, respectively. This strength improvement may be attributed to the reduction in pores in the samples as well as the addition of high young's modulus fillers.

The present subject matter may be further explained in the following items:

Item 1—A sintered dielectric material comprising before sintering, a solids portion including 10-99 wt % silica powder having a D-50 particle size of 0.5-30 µm, and 1-90 wt % glass component including 50-90 mole % $SiO_2$,
  5-35 mole % $B_2O_3$,
  0.1-10 mole % $Al_2O_3$,
  0.1-10 mole % $K_2O$,
  0.1-10 mole % $Na_2O$,
  0.1-20 mole % $Li_2O$,
  0.1-30 mole % F, and
  the total amount of $Li_2O+Na_2O+K_2O$ is 0.1-30 mole % of the glass component,
wherein the sintered dielectric material has a dielectric constant less than 8 and a Q value of greater than 500 when sintered at less than 1100° C.

Item 2: The sintered dielectric material according to item 1, wherein the solids portion further comprises one crystalline compound selected from the group consisting of
  0.1-10 wt % lithium calcium silicate,
  0.1-10 wt % ⊕-eucryptite,
  0.1-10 wt % lithium aluminum borate,
  0.1-10 wt % sillimanite,
  0.1-10 wt % albite,
  0.1-10 wt % magnesium phosphate,
  0.1-10 wt % aluminum phosphate,
  0.1-10 wt % cordierite,
  0.1-10 wt % willemite,
  0.1-10 wt % mullite,
  0.1-10 wt % wollastonite,
  0.1-10 wt % calcium borate,
  0.1-10 wt % forsterite,
  0.1-10 wt % alumina,
  0.1-10 wt % porous or hollow glass particles,
  0.1-20 wt % alkali fluorides,
  0.1-20 t % aluminum borates,
  0.1-20 wt % magnesium borosilicates,
  0.1-20 wt % magnesium aluminosilicates,
  0.1-20 wt % alkaline earth fluorides,
  0.1-20 wt % zinc borates,
  0.1-20 wt % zinc titanates, and
  combinations thereof.

Item 3: The sintered dielectric material according to item 1, wherein the silica powder is amorphous silica powder.

Item 4: The sintered dielectric material according to item 1, wherein the silica powder is crystalline silica powder selected from the group consisting of quartz, cristobalite, tridymite, and combinations thereof.

Item 5: The sintered dielectric material according to item 1, wherein the solids portion further comprises 5-50 wt % of one selected from the group consisting of:
  a Bi—B—Si oxide glass frit comprising:
    5-85 mole % $Bi_2O_3$,
    5-75 mole % $B_2O_3+SiO_2$,
    0.1-40 mold % $Li_2O+Na_2O+K_2O$,
    0.1-55 mol 3% ZnO, and
    0.1-20 mole % $TiO_2+ZrO_2$,
  a zinc oxide based glass frit comprising:
    5-65 mole % ZnO,
    10-65 mole % $SiO_2$, and
    5-55 mole % $B_2O_3$,
  an alkali-titanium-silicate glass frit comprising:
    5-55 mole % $Li_2O+Na_2O+K_2O+Cs_2O+Rb_2O$,
    2-26 mole % $TiO_2+ZrO_2$,
    5-75 mole % $B_2O_3+SiO_2$,
    0.1-30 mole % $TeO_2+V_2O_5+Sb_2O_5+P_2O_5$, 0.1-20 mole % MgO+CaO+BaO+SrO, and
0.1-20 mole % F,
an alkaline earth silicate glass frit comprising:
15-75 mole % BaO+CaO+SrO+MgO,
5-75 mole % $B_2O_3+SiO_2$,
0.1-55 mole % ZnO,
0.1-40 mole % $Li_2O+Na_2O+K_2O+Cs_2O+Rb_2O$, and
0.1-20 mole % $TiO_2+ZrO_2$,
a magnesium silicate glass frit comprising:
15-75 mole % MgO,
5-75 mole % $B_2O_3+SiO_2$,
0.1-55 mole % ZnO,
0.1-40 mole % $Li_2O+Na_2O+K_2O+Cs_2O+Rb_2O$, and
0.1-20 mole % $TiO_2+ZrO_2$,
a calcium silicate glass frit comprising:
15-75 mole % CaO,
5-75 mole % $B_2O_3+SiO_2$,
0.1-55 mole % ZnO,
0.1-40 mole % $Li_2O+Na_2O+K_2O+Cs_2O+Rb_2O$, and
0.1-20 mole % $TiO_2+ZrO_2$,
a strontium silicate glass frit comprising:
15-75 mole % SrO,
5-75 mole % $B_2O_3+SiO_2$,
0.1-55 mole % ZnO,
0.1-40 mole % $Li_2O+Na_2O+K_2O+Cs_2O+Rb_2O$, and
0.1-20 mole % $TiO_2+ZrO_2$,
a barium silicate glass frit comprising:
15-75 mole % BaO,
5-75 mole % $B_2O_3+SiO_2$,
0.1-55 mole % ZnO,
0.1-40 mole % $Li_2O+Na_2O+K_2O+Cs_2O+Rb_2O$, and
0.1-20 mole % $TiO_2+ZrO_2$, and
combinations thereof.

Item 6: The sintered dielectric material according to item 1, wherein the solids portion further comprises 0.1-10 wt % particles having an average size of from 10 nm to 30 um, and wherein the particles are selected from the group consisting of hollow silica spheres, hollow glass particles, porous silicate glass particles, porous organosilicate glass particles, xerogel particles, aerogel particles, mica particles, zeolite particles, and combinations thereof.

Item 7: The sintered dielectric material according to item 1, wherein the solids portion includes 10-95 wt % silica powder and 5-90 wt % glass component.

Item 8: The sintered dielectric material according to item 1, further comprising 0.1-30 wt % of an additive including one or more of:
a) nano-sized silica having a D50 particle size of 5-500 nm,
b) $Al_2O_3$ powder,
c) $ZrO_2$ powder,
d) $TiO_2$ powder,
e) SiC powder,
f) $Si_3N_4$ powder,
g) $Y_2O_3$ powder, or
h) MgO powder.

Item 9: An electronic component including the sintered dielectric material according to item 1.

Item 10: A method of forming a dielectric component, comprising:
providing a dielectric composition including a solids portion, the solids portion including 10-99 wt % silica powder having a D-50 particle size of 0.5-30 μm, and 1-90 wt % glass component including
50-90 mole % $SiO_2$,
0.1-35 mole % $B_2O_3$,
0.1-25 mole % $Al_2O_3$,
0.1-10 mole % $K_2O$,
0.1-10 mole % $Na_2O$,
0.1-20 mole % $Li_2O$,
0.1-30 mole % F, and
wherein $Li_2O+Na_2O+K_2O$ is 0.1-30 mole % of the glass component, and
heating the dielectric composition to 700-1100° C. for 10-10000 minutes in order to sinter the solids portion and thereby form the dielectric component;
wherein the dielectric component has a dielectric constant less than 8 and a Q value of greater than 500.

Item 11: The method according to item 10, wherein the solids portion further comprises one crystalline compound selected from the group consisting of:
0.1-10 wt % lithium calcium silicate,
0.1-10 wt % β-eucryptite,
0.1-10 wt % lithium aluminum borate,
0.1-10 wt % sillimanite,
0.1-10 wt % albite,
0.1-10 wt % magnesium phosphate,
0.1-10 wt % aluminum phosphate,
0.1-10 wt % cordierite,
0.1-10 wt % willemite,
0.1-10 wt % mullite,
0.1-10 wt % wollastonite,
0.1-10 wt % calcium borate,
0.1-10 wt % forsterite,
0.1-10 wt % alumina,
0.1-10 wt % porous or hollow glass particles,
0.1-20 wt % alkali fluorides,
0.1-30 wt % aluminum borates,
0.1-20 wt % magnesium borosilicates,
0.1-20 wt % magnesium aluminosilicates,
0.1-20 wt % alkaline earth fluorides,
0.1-20 wt % zinc borates,
0.1-20 wt % zinc titanates, and
combinations thereof.

Item 12: The method according to item 10, wherein the silica powder is amorphous silica powder.

Item 13: The method according to item 10, wherein the silica powder is crystalline silica powder selected from the group consisting of quartz, cristobalite, tridymite, and combinations thereof.

Item 14: The method according to item 10, wherein the solids portion further comprises 5-50 wt % of one selected from the group consisting of:
a Bi—B—Si oxide glass frit comprising:
5-85 mole % $Bi_2O_3$,
5-75 mole % $B_2O_3+SiO_2$,
0.1-40 mold % $Li_2O+Na_2O+K_2O$,
0.1-55 mol 3% ZnO, and
0.1-20 mole % $TiO_2+ZrO_2$,
a zinc oxide based glass frit comprising:
5-65 mole % ZnO,
10-65 mole % $SiO_2$, and
5-55 mole % $B_2O_3$,
an alkali-titanium-silicate glass frit comprising:
5-55 mole % $Li_2O+Na_2O+K_2O+Cs_2O+Rb_2O$,
2-26 mole % $TiO_2+ZrO_2$,
5-75 mole % $B_2O_3+SiO_2$,
0.1-30 mole % $TeO_2+V_2O_5+Sb_2O_5+P_2O_5$,
0.1-20 mole % MgO+CaO+BaO+SrO, and
0.1-20 mole % F,
an alkaline earth silicate glass frit comprising:
15-75 mole % BaO+CaO+SrO+MgO,
5-75 mole % $B_2O_3+SiO_2$,
0.1-55 mole % ZnO, 0.1-40 mole % Li$_2$O+Na$_2$O+K$_2$O+Cs$_2$O+Rb$_2$O, and
0.1-20 mole % TiO$_2$+ZrO$_2$,
a magnesium silicate glass frit comprising:
15-75 mole % MgO,
5-75 mole % B$_2$O$_3$+SiO$_2$,
0.1-55 mole % ZnO,
0.1-40 mole % Li$_2$O+Na$_2$O+K$_2$O+Cs$_2$O+Rb$_2$O, and
0.1-20 mole % TiO$_2$+ZrO$_2$,
a calcium silicate glass frit comprising:
15-75 mole % CaO,
5-75 mole % B$_2$O$_3$+SiO$_2$,
0.1-55 mole % ZnO,
0.1-40 mole % Li$_2$O+Na$_2$O+K$_2$O+Cs$_2$O+Rb$_2$O, and
0.1-20 mole % TiO$_2$+ZrO$_2$,
a strontium silicate glass frit comprising:
15-75 mole % SrO,
5-75 mole % B$_2$O$_3$+SiO$_2$,
0.1-55 mole % ZnO,
0.1-40 mole % Li$_2$O+Na$_2$O+K$_2$O+Cs$_2$O+Rb$_2$O, and
0.1-20 mole % TiO$_2$+ZrO$_2$,
a barium silicate glass frit comprising:
15-75 mole % BaO,
5-75 mole % B$_2$O$_3$+SiO$_2$,
0.1-55 mole % ZnO,
0.1-40 mole % Li$_2$O+Na$_2$O+K$_2$O+Cs$_2$O+Rb$_2$O, and
0.1-20 mole % TiO$_2$+ZrO$_2$, and
combinations thereof.

Item 15: The method according to item 10, wherein the solids portion further comprises 0.1-10 wt % particles having an average size of from 10 nm to 30 um, and wherein the particles are selected from the group consisting of hollow silica spheres, hollow glass particles, porous silicate glass particles, porous organosilicate glass particles, xerogel particles, aerogel particles, mica particles, zeolite particles, and combinations thereof.

Item 16: The method according to item 10, wherein the solids portion includes 10-95 wt % silica powder and 5-90 wt % glass component.

Item 17: The method according to item 10, wherein the solids portion further includes 0.1-30 wt % of an additive including one or more of:
a) nano-sized silica having a D50 particle size of 5-500 nm,
b) Al$_2$O$_3$ powder,
c) ZrO$_2$ powder,
d) TiO$_2$ powder,
e) SiC powder,
f) Si$_3$N$_4$ powder,
g) Y$_2$O$_3$ powder, or
h) MgO powder.

Many other benefits will no doubt become apparent from future application and development of this technology.

All patents, applications, standards, and articles noted herein are hereby incorporated by reference in their entirety.

The present subject matter includes all operable combinations of features and aspects described herein. Thus, for example if one feature is described in association with an embodiment and another feature is described in association with another embodiment, it will be understood that the present subject matter includes embodiments having a combination of these features.

As described hereinabove, the present subject matter solves many problems associated with previous strategies, systems and/or devices. However, it will be appreciated that various changes in the details, materials and arrangements of components, which have been herein described and illustrated in order to explain the nature of the present subject matter, may be made by those skilled in the art without departing from the principle and scopes of the claimed subject matter, as expressed in the appended claims.

What is claimed is:

1. A sintered dielectric material comprising before sintering, a solids portion including 10-99 wt % silica powder having a D-50 particle size of 0.5-30 µm, and 1-90 wt % glass component including:
   50-90 mole % SiO$_2$,
   0.1-35 mole % B$_2$O$_3$,
   0.1-25 mole % Al$_2$O$_3$,
   0.1-10 mole % K$_2$O,
   0.1-10 mole % Na$_2$O,
   0.1-20 mole % Li$_2$O,
   0.1-30 mole % F, and
   the total amount of Li$_2$O+Na$_2$O+K$_2$O is 0.3-30 mole % of the glass component,
   wherein the sintered dielectric material has a dielectric constant less than 8 and a Q value of greater than 500 when sintered at less than 1100° C.

2. The sintered dielectric material according to claim 1, wherein the solids portion further comprises one crystalline compound selected from the group consisting of:
   0.1-10 wt % lithium calcium silicate,
   0.1-10 wt % β-eucryptite,
   0.1-10 wt % lithium aluminum borate,
   0.1-10 wt % magnesium aluminum silicate,
   0.1-10 wt % sillimanite,
   0.1-10 wt % albite,
   0.1-10 wt % magnesium phosphate,
   0.1-10 wt % aluminum phosphate,
   0.1-10 wt % cordierite,
   0.1-10 wt % willemite,
   0.1-10 wt % mullite,
   0.1-10 wt % wollastonite,
   0.1-10 wt % calcium borate,
   0.1-10 wt % forsterite,
   0.1-10 wt % alumina,
   0.1-10 wt % porous or hollow glass particles,
   0.1-20 wt % alkali fluorides,
   0.1-30 wt % aluminum borate,
   0.1-20 wt % magnesium borosilicate,
   0.1-20 wt % magnesium aluminosilicate,
   0.1-20 wt % alkaline earth fluorides,
   0.1-20 wt % zinc borates,
   0.1-20 wt % zinc titanates, and
   combinations thereof.

3. The sintered dielectric material according to claim 1, wherein the silica powder is amorphous silica powder.

4. The sintered dielectric material according to claim 1, wherein the silica powder is crystalline silica powder selected from the group consisting of quartz, cristobalite, tridymite, and combinations thereof.

5. The sintered dielectric material according to claim 1, wherein the solids portion further comprises 5-50 wt % of one selected from the group consisting of:
   a Bi—B—Si oxide glass frit comprising:
     5-85 mole % Bi$_2$O$_3$,
     5-75 mole % B$_2$O$_3$+SiO$_2$,
     0.1-40 mole % Li$_2$O+Na$_2$O+K$_2$O,
     0.1-55 mole % ZnO, and
     0.1-20 mole % TiO$_2$+ZrO$_2$,
   a zinc oxide based glass frit comprising:
     5-65 mole % ZnO,
     10-65 mole % SiO$_2$, and
     5-55 mole % B$_2$O$_3$, an alkali-titanium-silicate glass frit comprising:
  5-55 mole % $Li_2O+Na_2O+K_2O+Cs_2O+Rb_2O$,
  2-26 mole % $TiO_2+ZrO_2$,
  5-75 mole % $B_2O_3+SiO_2$,
  0.1-30 mole % $TeO_2+V_2O_5+Sb_2O_5+P_2O_5$,
  0.1-20 mole % $MgO+CaO+BaO+SrO$, and
  0.1-20 mole % F,
an alkaline earth silicate glass frit comprising:
  15-75 mole % $BaO+CaO+SrO+MgO$,
  5-75 mole % $B_2O_3+SiO_2$,
  0.1-55 mole % ZnO,
  0.1-40 mole % $Li_2O+Na_2O+K_2O+Cs_2O+Rb_2O$, and
  0.1-20 mole % $TiO_2+ZrO_2$,
a magnesium silicate glass frit comprising:
  15-75 mole % MgO,
  5-75 mole % $B_2O_3+SiO_2$,
  0.1-55 mole % ZnO,
  0.1-40 mole % $Li_2O+Na_2O+K_2O+Cs_2O+Rb_2O$, and
  0.1-20 mole % $TiO_2+ZrO_2$,
a calcium silicate glass frit comprising:
  15-75 mole % CaO,
  5-75 mole % $B_2O_3+SiO_2$,
  0.1-55 mole % ZnO,
  0.1-40 mole % $Li_2O+Na_2O+K_2O+Cs_2O+Rb_2O$, and
  0.1-20 mole % $TiO_2+ZrO_2$,
a strontium silicate glass frit comprising:
  15-75 mole % SrO,
  5-75 mole % $B_2O_3+SiO_2$,
  0.1-55 mole % ZnO,
  0.1-40 mole % $Li_2O+Na_2O+K_2O+Cs_2O+Rb_2O$, and
  0.1-20 mole % $TiO_2+ZrO_2$,
a barium silicate glass frit comprising:
  15-75 mole % BaO,
  5-75 mole % $B_2O_3+SiO_2$,
  0.1-55 mole % ZnO,
  0.1-40 mole % $Li_2O+Na_2O+K_2O+Cs_2O+Rb_2O$, and
  0.1-20 mole % $TiO_2+ZrO_2$, and
combinations thereof.

6. The sintered dielectric material according to claim 1, wherein the solids portion further comprises 0.1-10 wt % particles having an average size of from 10 nm to 30 um, and
  wherein the particles are selected from the group consisting of hollow silica spheres, hollow glass particles, porous silicate glass particles, porous organosilicate glass particles, xerogel particles, aerogel particles, mica particles, zeolite particles, and combinations thereof.

7. The sintered dielectric material according to claim 1, wherein the solids portion includes 10-95 wt % silica powder and 5-90 wt % glass component.

8. The sintered dielectric material according to claim 1, further comprising 0.1-30 wt % of an additive including one or more of:
  a) nano-sized silica having a D50 particle size of 5-500 nm,
  b) $Al_2O_3$ powder,
  c) $ZrO_2$ powder,
  d) $TiO_2$ powder,
  e) SiC powder,
  f) $Si_3N_4$ powder,
  g) $Y_2O_3$ powder, or
  h) MgO powder.

9. An electronic component including the sintered dielectric material according to claim 1.

10. A method of forming a dielectric component, comprising:
  providing a dielectric composition including a solids portion, the solids portion including 10-99 wt % silica powder having a D-50 particle size of 0.5-30 μm, and 1-90 wt % glass component including
    50-90 mole % $SiO_2$,
    0.1-35 mole % $B_2O_3$,
    0.1-25 mole % $Al_2O_3$,
    0.1-10 mole % $K_2O$,
    0.1-10 mole % $Na_2O$,
    0.1-20 mole % $Li_2O$,
    0.1-30 mole % F, and
    wherein $Li_2O+Na_2O+K_2O$ is 0.3-30 mole % of the glass component, and
  heating the dielectric composition to 700-1100° C. for 10-10000 minutes in order to sinter the solids portion and thereby form the dielectric component;
  wherein the dielectric component has a dielectric constant less than 8 and a Q value of greater than 500.

11. The method according to claim 10, wherein the solids portion further comprises one crystalline compound selected from the group consisting of:
  0.1-10 wt % lithium calcium silicate,
  0.1-10 wt % β-eucryptite,
  0.1-10 wt % lithium aluminum borate,
  0.1-10 wt % magnesium aluminum silicate,
  0.1-10 wt % sillimanite,
  0.1-10 wt % albite,
  0.1-10 wt % magnesium phosphate,
  0.1-10 wt % aluminum phosphate,
  0.1-10 wt % cordierite,
  0.1-10 wt % willemite,
  0.1-10 wt % mullite,
  0.1-10 wt % wollastonite,
  0.1-10 wt % calcium borate,
  0.1-10 wt % forsterite,
  0.1-10 wt % alumina,
  0.1-10 wt % porous or hollow glass particles,
  0.1-20 wt % alkali fluorides,
  0.1-30 wt % aluminum borates,
  0.1-20 wt % magnesium borosilicates,
  0.1-20 wt % magnesium aluminosilicates,
  0.1-20 wt % alkaline earth fluorides,
  0.1-20 wt % zinc borates,
  0.1-20 wt % zinc titanates, and
  combinations thereof.

12. The method according to claim 10, wherein the silica powder is amorphous silica powder.

13. The method according to claim 10, wherein the silica powder is crystalline silica powder selected from the group consisting of quartz, cristobalite, tridymite, and combinations thereof.

14. The method according to claim 10, wherein the solids portion further comprises 5-50 wt % of one selected from the group consisting of:
  a Bi—B—Si oxide glass frit comprising:
    5-85 mole % $Bi_2O_3$,
    5-75 mole % $B_2O_3+SiO_2$,
    0.1-40 mole % $Li_2O+Na_2O+K_2O$,
    0.1-55 mole % ZnO, and
    0.1-20 mole % $TiO_2+ZrO_2$,
  a zinc oxide based glass frit comprising:
    5-65 mole % ZnO,
    10-65 mole % $SiO_2$, and
    5-55 mole % $B_2O_3$,
  an alkali-titanium-silicate glass frit comprising:
    5-55 mole % $Li_2O+Na_2O+K_2O+Cs_2O+Rb_2O$,
    2-26 mole % $TiO_2+ZrO_2$,
    5-75 mole % $B_2O_3+SiO_2$,
    0.1-30 mole % $TeO_2+V_2O_5+Sb_2O_5+P_2O_5$, 0.1-20 mole % MgO+CaO+BaO+SrO, and
0.1-20 mole % F,
an alkaline earth silicate glass frit comprising:
  15-75 mole % BaO+CaO+SrO+MgO,
  5-75 mole % $B_2O_3$+$SiO_2$,
  0.1-55 mole % ZnO,
  0.1-40 mole % $Li_2O$+$Na_2O$+$K_2O$+$Cs_2O$+$Rb_2O$, and
  0.1-20 mole % $TiO_2$+$ZrO_2$,
a magnesium silicate glass frit comprising:
  15-75 mole % MgO,
  5-75 mole % $B_2O_3$+$SiO_2$,
  0.1-55 mole % ZnO,
  0.1-40 mole % $Li_2O$+$Na_2O$+$K_2O$+$Cs_2O$+$Rb_2O$, and
  0.1-20 mole % $TiO_2$+$ZrO_2$,
a calcium silicate glass frit comprising:
  15-75 mole % CaO,
  5-75 mole % $B_2O_3$+$SiO_2$,
  0.1-55 mole % ZnO,
  0.1-40 mole % $Li_2O$+$Na_2O$+$K_2O$+$Cs_2O$+$Rb_2O$, and
  0.1-20 mole % $TiO_2$+$ZrO_2$,
a strontium silicate glass frit comprising:
  15-75 mole % SrO,
  5-75 mole % $B_2O_3$+$SiO_2$,
  0.1-55 mole % ZnO,
  0.1-40 mole % $Li_2O$+$Na_2O$+$K_2O$+$Cs_2O$+$Rb_2O$, and
  0.1-20 mole % $TiO_2$+$ZrO_2$,
a barium silicate glass frit comprising:
  15-75 mole % BaO,
  5-75 mole % $B_2O_3$+$SiO_2$,
  0.1-55 mole % ZnO,
  0.1-40 mole % $Li_2O$+$Na_2O$+$K_2O$+$Cs_2O$+$Rb_2O$, and
  0.1-20 mole % $TiO_2$+$ZrO_2$, and
combinations thereof.

15. The method according to claim 10, wherein the solids portion further comprises 0.1-10 wt % particles having an average size of from 10 nm to 30 um, and
  wherein the particles are selected from the group consisting of hollow silica spheres, hollow glass particles, porous silicate glass particles, porous organosilicate glass particles, xerogel particles, aerogel particles, mica particles, zeolite particles, and combinations thereof.

16. The method according to claim 10, wherein the solids portion includes 10-95 wt % silica powder and 5-90 wt % glass component.

17. The method according to claim 10, wherein the solids portion further includes 0.1-30 wt % of an additive including one or more of:
  a) nano-sized silica having a D50 particle size of 5-500 nm,
  b) $Al_2O_3$ powder,
  c) $ZrO_2$ powder,
  d) $TiO_2$ powder,
  e) SiC powder,
  i) $Si_3N_4$ powder,
  j) $Y_2O_3$ powder, or
  f) MgO powder.

* * * * *